United States Patent [19]

Eccleston

[11] Patent Number: 4,841,170
[45] Date of Patent: Jun. 20, 1989

[54] TEMPERATURE CONTROLLED HYBRID ASSEMBLY

[75] Inventor: Larry E. Eccleston, Edmonds, Wash.

[73] Assignee: John Fluke Mfg. Co., Inc., Everett, Wash.

[21] Appl. No.: 939,522

[22] Filed: Dec. 8, 1986

[51] Int. Cl.⁴ ............................................. H01L 27/00
[52] U.S. Cl. ..................................... 307/310; 307/303; 357/28
[58] Field of Search ....................... 323/289, 369, 907; 307/310, 303.1; 357/28, 81

[56] References Cited

U.S. PATENT DOCUMENTS

| | | | |
|---|---|---|---|
| 3,444,399 | 5/1969 | Jones | 307/310 |
| 3,571,517 | 5/1971 | Merryman | 357/28 |
| 3,703,651 | 11/1972 | Blowers | 307/310 |
| 3,781,515 | 12/1973 | Morris, Jr. et al. | 357/28 |
| 4,146,903 | 3/1979 | Dobkin | 323/289 |

Primary Examiner—John Zazworsky
Attorney, Agent, or Firm—Stephen A. Becker; Israel Gopstein; Mikio Ishimaru

[57] ABSTRACT

A hybrid circuit structure includes an electrical circuit and a heating circuit therefor, both mounted on a single substrate. Valuable substrate space is saved by mounting the electrical circuit components on one surface of the substrate and the heating circuit elements on the opposite surface. A temperature control circuit is included, preferably mounted on the same surface as the electrical circuit components. Precision resistors for gain control and other functions may be provided on a separate substrate which may be mounted directly to the single substrate or to a separator therebetween. The precision resistors are in thermal contact with the temperature controlled heating circuit, thereby further increasing the stability of the circuit.

22 Claims, 1 Drawing Sheet

U.S. Patent   Jun. 20, 1989   4,841,170
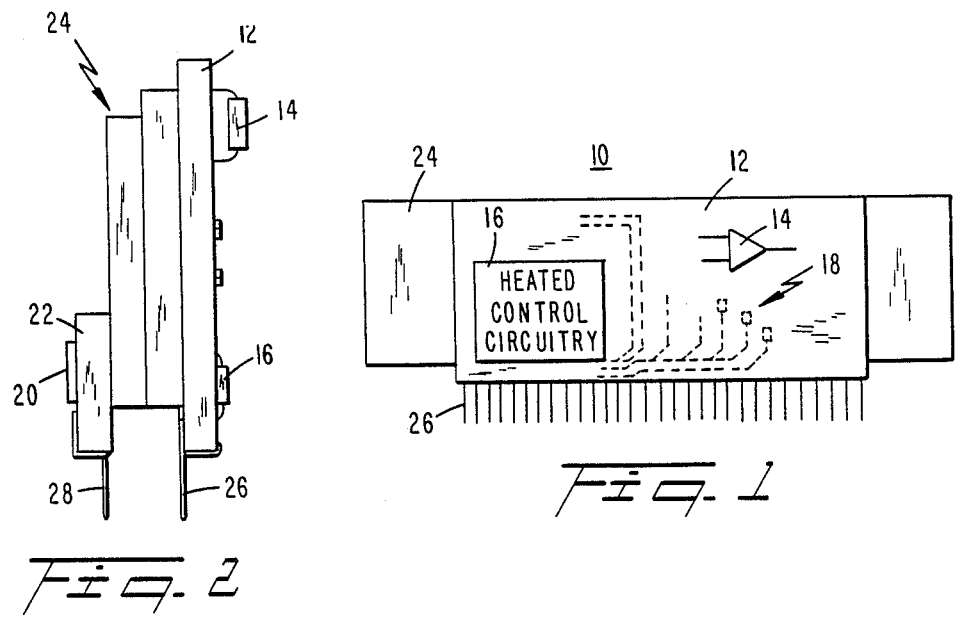
Fig. 2
Fig. 1
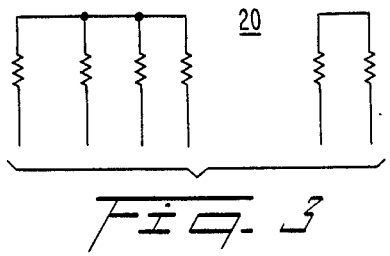
Fig. 3
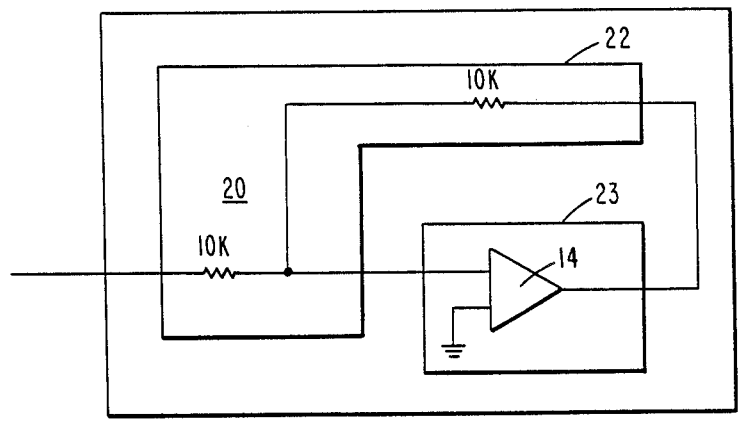
Fig. 4

TEMPERATURE CONTROLLED HYBRID ASSEMBLY

TECHNICAL FIELD

This invention relates to electrical circuits, and more specifically to arrangements for maintaining electrical circuits at controlled temperatures to provide precisely controllable temperature dependent operational characteristics to components of the circuits.

BACKGROUND ART

It is known that electrical characteristics of circuit components, whether discrete or integrated, are frequently sensitive to and variable with temperature. It has accordingly been known in the prior art to try to stabilize operational characteristics and electrical parameters of electronic circuits by attempting to maintain a relatively constant ambient temperature for the circuit.

Typically, electrical parameters of circuit components, such as resistors, are measured at and remain substantially constant at known, constant, temperatures. It is thus known to operate a circuit at a predetermined temperature to maintain the electrical characteristics thereof at fixed values. However, temperature control and stabilization has previously been expensive to implement because of the need for additional circuitry and the increased space requirements therefor.

Difficulties encountered in prior art efforts to attain temperature stabilized operation have often related to obtaining an arrangement of the electronic circuit to be stabilized together with apparatus for controlling the ambient temperature. Additionally, and more specifically, it has been difficult to combine the circuit to be controlled with specific heating apparatus to provide the desired operating temperature.

Accordingly, in the prior art it has become accepted to control the ambient temperature of a circuit by enclosing the circuit within an oven structure.

Such a prior art approach, however, is expensive and thus tends to discourage operation of electronic circuits at desired temperatures. In addition to requiring the heat generating circuitry, the prior art temperature control arrangements require an enclosure. Such enclosures, even if limited to surround a particular circuit board or arrangement, add both to the expense of fabricating the device and to the space and volume required thereby.

Accordingly, temperature stabilized operation has been unavailable in inexpensive electronic circuits and devices. The precision available by operation of electrical circuits at known and controlled temperatures has been relegated to more expensive devices and has been generally unavailable in less expensive devices, such as used in consumer electronics.

There has thus been a need in the prior art for easily implemented and inexpensive temperature control arrangements for electronic circuits. More specifically, there has been a need for heat generating and heat control circuits which do not require expensive ovens or excessive space and volume for implementation.

DISCLOSURE OF INVENTION

It is thus an object of the present invention to overcome the difficulties of the prior art and to provide an inexpensive electronic temperature control arrangement for controlling the ambient operating temperature for electrical devices.

It is a more specific object of the invention to provide a heat control arrangement for electrical devices, wherein the heat controlling structure does not require substantial increases in space and volume for implementation.

A more particular object of the invention is the provision of a temperature control and heat generating arrangement for an electronic circuit which does not require an enclosure.

It is yet another object of the invention to provide a structure for implementing a compact electronic circuit, including therein on a single circuit board both an operating circuit and a temperature controlled heat generating circuit therefor.

Yet another object of the invention is the provision of a sandwich structure wherein an electronic circuit is provided on one surface of a substrate and a heat generating resistive circuit is provided on an opposite surface of the substrate.

It is still a further object of the invention to provide a hybrid circuit including an electronic circuit on one surface of a substrate and a heat generating circuit on an opposite surface of the substrate.

Still another object of the invention is to provide a hybrid circuit including an electronic circuit on one surface of a substrate and a heat generating circuit on an opposite surface of the substrate, together with an arrangement wherein thin or thick film resistive networks are formed on a separate substrate, and wherein the separate substrate including the resistive network is mounted to the heat generating circuit on the opposite surface of the first mentioned substrate.

Yet a further object of the invention is to mount a hybrid circuit assembly including both an electronic circuit and a heat generating circuit on one side of, and in good thermal conductance with, a ceramic separator having a known heat conductivity and to mount to the other side of the separator a resistive network of matched resistors used in the electronic circuit.

In accordance with these and other objects of the invention, there is generally provided an electronic circuit arrangement comprising an electrical circuit formed on a substrate, a temperature control component formed on the substrate, and a heating circuit formed on the substrate for heating the electrical circuit to operate under predetermined temperature conditions. The heat generating circuit is connected to and responsive to the temperature control component, while the heat generating circuit is in close thermal conductivity with the electrical circuit for eliminating requirement of a heat enclosure housing therefor.

Preferably, the arrangement includes a hybrid electrical circuit structure, and the electrical circuit includes at least one component, such as an integrated circuit chip, mounted on the substrate. The temperature control component includes a further circuit mounted on the substrate, which may also be an integrated circuit. The heat generating circuit includes film resistors screened on the substrate.

In accordance with the preferred embodiment of the invention, the integrated circuit component of the electrical circuit is mounted on one surface of the substrate while the heat generating film resistors are formed on the opposite surface of the substrate.

The temperature control component, which is mounted on the substrate, is preferably mounted on the same surface of the substrate as the electrical circuitry component.

In accordance with another aspect of the invention, there is also provided a separate network, for controlling gain, for example, of the components of the electrical circuit. The separate circuit is preferably formed of components matched to each other, such as precision matched resistors having a one ppm/°C. matching, for example. The separate network is preferably formed on a separate substrate, mounted to the opposite surface of the component and heater substrate.

The separate substrate may be bonded to the opposite surface of the component and heater substrate. Alternatively, a high thermal conductivity ceramic separator may be bonded along one surface thereof to the opposite surface of the component and heater bearing substrate, and the separate substrate may be bonded to the opposite surface of the ceramic separator.

Moreover, the separate network may be sealed in a glass housing for improved stability and operation, by excluding dust, humidity and the like from affecting the various components thereof.

The separate substrate and the component and heater substrate are each provided with contact connectors along a respective edge of each. The separate substrate may be mounted to the component substrate so that both sets of leads are along one edge of the combined structure, thus forming a SIP (single-in-line-package). Alternatively, the two substrates may be mounted so that the connectors are formed on opposite edges of the combined structure, thus forming a DIP (dual-inline-package).

BRIEF DESCRIPTION OF THE DRAWINGS

The foregoing and other objects, features and advantages of the present invention will become more readily apparent to those skilled in the art to which the invention pertains upon reference to the following detailed description of one of the best modes for carrying out the invention, when considered in conjunction with the accompanying drawing in which a preferred embodiment of the invention is shown and described by way of illustration, and not of limitation, wherein:

FIG. 1 shows a hybrid circuit board incorporating the present invention;

FIG. 2 shows a side view of a sandwich structure including the hybrid of FIG. 1 and a separate substrate including a precision resistance network thereon;

FIG. 3 illustrates the resistance network formed on the separate substrate of FIG. 2; and FIG. 4 shows a schematic representation of a circuit interconnection between a component included on the hybrid of FIG. 1 and the resistance network of FIG. 3.

BEST MODE FOR CARRYING OUT THE INVENTION

In accordance with applicant's invention, there is thus provided a hybrid circuit board, as shown at FIG. 1, which incorporates both an electrical circuit and a heat generating circuit and a temperature control circuit therefor.

Referring now to FIG. 1, there is shown a structural arrangement 10, which includes a substrate 12, on which is formed an electrical circuit, symbolized by a component amplifier 14.

The electrical circuit and various of its components may be formed of any of a number of different electrical and electronic devices known in the art. Thus, discrete, film, or integrated components may be used. Substrate 12 is thus preferably a hybrid circuit board which may be used to mount discrete or integrated components, as well as to form screened film components.

In one circuit utilizing the invention, a digital-to-analogue converter (DAC) is formed, incorporating therein an integrated circuit chip which includes amplifier 14. As hereinbelow described, gain control networks, and particularly resistive networks for controlling the gain of amplifier 14, may also be included on the substrate 12.

In accordance with the invention, there is provided on substrate 12 a heater control circuit 16 as well as a heating circuit 18. Preferably, heating circuit 18 is comprised of a weaving pattern of film resistors, whether thin or thick, screened onto the substrate 12. In the following description, the term "component" will refer to the electrical circuit components, such as amplifier 14, in opposition to the various elements of the heating circuit 18.

As further shown in FIG. 1, the electrical circuit components, such as amplifier 14, are mounted (or formed) on one surface of substrate 12, hereinafter identified as a component bearing surface of the substrate. The elements of the heating circuit 18, illustrated by dashed lines, are preferably formed on the opposite surface of the substrate. In this arrangement, substrate 12 is preferably formed of a high thermal conductivity material, such as ceramic material, to provide good thermal contact between the heating circuit and the heated components and temperature control circuit.

A significant advantage of the inventive arrangement is the productive utilization of substrate space which is wasted in prior art structures. More particularly, use of the rear surface of a substrate to support a heating circuit reduces the space required by the entire heated electronic circuit and thus reduces the size of the substrate. As a result, the heating requirements are reduced and the control requirements are simplified, thus advantageously reducing the complexity of the heat control circuitry 16.

The reduced size of the hybrid arrangement 10 further enables the heating circuit 18 to heat the circuit components without requiring an enclosure therefor, thus further reducing the expense of forming a heated electrical circuit.

In accordance with another aspect of the invention, precision of operation of the various components formed and mounted on the component bearing surface of substrate 12 is increased by providing a separate network of precision matched components Thus, the gain of the amplifier 14 of a DAC incorporating the present invention may be precisely controlled with the aid of a resistive network of matched film resistors, illustrated at 20 in FIG. 3. The resistors of the network 20 may be thin film or thick film resistors. The separate resistive network may be provided on a separate substrate 22, as illustrated at FIG. 2.

In the separately provided substrate 22, resistances (or other circuit components) may be matched to track one another as closely as 1 ppm/°C., and the separate substrate 22, including thereon the matched network 20, may be separately mounted to the substrate 12.

As will be understood from the following description, the separate substrate may be mounted directly to the rear surface of substrate 12. Alternatively, as illustrated in FIG. 2, a high thermal conductivity ceramic spacer 24 may be used between the two substrates. In the sandwich structure of FIG. 2, component bearing substrate 12 is mounted to one surface of the ceramic spacer 24, while the separate substrate incorporating the precision control network thereon is mounted to the other surface of the spacer.

The circuit arrangement implemented by the inventive structure is shown schematically in FIG. 4. As shown therein, amplifier 14, for example, is mounted on the component bearing surface of substrate 12, illustrated at 23. The gain control circuit 20, which may be comprised of two 10-K resistors, for example, is mounted on the separate substrate 22. The resistive network 20 on substrate 22 may be connected to the components of the electrical circuit on substrate 12 in any manner known in the art.

In accordance with another aspect of the invention, it is noted that in the arrangement of FIG. 2, the two substrates 12 and 22 are each bonded to a respective surface of spacer 24 by a thin molecular layer of thermally conductive epoxy, or the like.

Thus, the heating circuit 18 is in good thermal contact both with the components mounted on the component bearing surface of substrate 12 and with the resistive network of substrate 22, providing for improved temperature control for the circuits on each substrate. In that regard, the high thermal conductivity of the ceramic separator, combined with the heated environment for substrate 22 and the gain control circuitry thereon, results in a heat gain of 20 to the resistive network 20.

Accordingly, while a typical temperature coefficient for a matched resistive network may be in the range of 1 to 5 ppm/°C., the coefficient for the network 20, mounted on substrate 22 and in thermal contact with heating circuit 18 of substrate 12 as shown in FIG. 2 in accordance with the invention was reduced to a level of several tenths ppm/°C.

It should be noted, however, that the substrate 22 may be bonded directly to the rear surface of substrate 12, without the intervening ceramic separator 24.

Separator 24 is used in the embodiment of FIG. 2 to assure that the resistors in resistive network 20 and in the heating circuit 18 do not scratch one another or otherwise interfere with proper operation of each. By preventing such inadvertent contact and by providing ample clearance for leads and connectors on both substrates, manufacturability of the device is simplified by the ceramic separator 24. However, by providing sufficient clearance between the two substrates and by providing sufficient thickness of the bonding epoxy, for example, substrate 22 may be mounted directly onto substrate 12, as above noted.

In the preferred embodiment, resistive network 20 is sealed by a glass cover over substrate 22, in order to improve stability of the network by eliminating exposure to humidity, dust, or other contaminants.

As hereinabove mentioned, and as will be appreciated by those of ordinary skill in the art to which the invention pertains, the components and elements of each substrate are provided with leads and connectors for contact with external devices, power sources, and the like. Referring again to FIGS. 1 and 2, connecting pins 26 are provided at one edge of the substrate 12. Pins 26 provide contact to the various electrical components on the component bearing surface of the substrate as well as to the heating circuit elements. As is also shown in FIG. 2, connecting pins 28 are provided at an edge of substrate 22 for contacting the resistive network 20 thereon.

In the arrangement of FIG. 2 the connecting pins 26 and 28 are provided along the same edge of the combined structure. Thus, the structure of FIG. 2 may be mounted in a circuit board socket as a single-inline-package (SIP). However, it should be realized that the connecting pins 26 and 28 may be provided at opposite edges of the combined structure. Such an arrangement results in a dual-inline-package (DIP) structure, and may be used to mount the combined structure in a DIP socket of a circuit board. The DIP structure may be more easily attained in an arrangement wherein ceramic spacer 24 is not used.

There has thus been described an arrangement wherein an electrical circuit and a heating circuit therefor are both mounted on a single substrate. More particularly, there has been described an arrangement wherein valuable space is saved by mounting the electrical circuit components on one surface of the substrate and the heating circuit elements on the opposite surface. A temperature control circuit is included, preferably mounted on the same surface as the electrical circuit components in order to monitor accurately the temperature of the components. Precision resistors for gain control and other functions are also provided, on a separate substrate which may be mounted directly to the single substrate or to a separator therebetween. The precision resistors are accordingly also heated by the temperature controlled heating circuit, thereby further increasing the stability of the circuit.

The foregoing description of the preferred embodiment of the invention has been presented for purposes of illustration and description and is not intended to be exhaustive or to limit the invention to the precise forms disclosed, since many modifications and variations are possible in light of the above teaching. The embodiment was chosen and described in order best to explain the principles of the invention and its practical application, thereby to enable others skilled in the art best to utilize the invention in various embodiments and with various modifications as are suited to the particular use contemplated therefor. It is intended that the scope of the invention be defined by the claims appended hereto, when interpreted in accordance with full breadth to which they are legally and equitably entitled.

I claim:

1. A hybrid electronic circuit arrangement comprising:
    a substrate;
    an electrical circuit formed on said substrate;
    a temperature control means formed on said substrate; and
    heat generating circuit means formed on said substrate for heating said electrical circuit to operate at predetermined temperature conditions,
    said heat generating circuit means connected to and responsive to said temperature control means,
    said heat generating circuit means in close thermal conductivity with said electrical circuit for eliminating requirement of heat enclosure therefor,
    at least one element of said electrical circuit, said temperature control means, and said heat generating circuit means comprising an integrated circuit and at least another element of said electrical circuit, said temperature control means, and said heat generating circuit means comprising a film resistor.

2. A hybrid electronic circuit arrangement as recited in claim 1, wherein
said electrical circuit includes at least one component mounted on said substrate,
said temperature control means includes a further circuit mounted on said substrate, and
said heat generating circuit means comprises a plurality of film resistors on said substrate.

3. A hybrid electronic circuit as recited in claim 2 wherein said electrical circuit component is mounted on one surface of said substrate forming a component bearing surface, and
said plurality of film resistors of said heat generating circuit means are formed on the opposite surface of said substrate.

4. A hybrid electronic circuit as recited in claim 2 wherein said electrical circuit component comprises an integrated circuit chip.

5. An electronic circuit arrangement as recited in claim 1, wherein said electrical circuit comprises a plurality of components, at least one component mounted on said substrate and at least one component mounted on a separate substrate, said substrates separated from one another by a spacer, said substrate and said spacer comprising a material common thereto, whereby thermally caused relative displacement between said substrate and said spacer is reduced.

6. An electronic circuit arrangement as recited in claim 5 wherein said material common to said substrate and to said spacer comprises a ceramic.

7. An electronic circuit arrangement comprising:
a substrate;
an electrical circuit formed on said substrate;
a temperature control means formed on said substrate; and
heat generating circuit means formed on said substrate for heating said electrical circuit to operate at predetermined temperature conditions,
said heat generating circuit means connected to and responsive to said temperature control means,
said heat generating circuit means being in close thermal conductivity with said electrical circuit for eliminating requirement of a heat enclosure therefor,
said electrical circuit including at least one component mounted on said substrate,
said temperature control means including a further circuit mounted on said substrate, and
wherein said electrical circuit component is mounted on one surface of said substrate forming a component bearing surface, and
said heat generating circuit means is formed on the opposite surface of said substrate, and
further comprising a separate network formed of components matched to each other and comprising a high precision portion of said electrical circuit,
said separate network formed on a separate substrate, said separate substrate mounted to said opposite surface of said first mentioned substrate.

8. An electronic circuit as recited in claim 7 wherein said separate substrate is bonded to said opposite surface of said first mentioned substrate.

9. An electronic circuit as recited in claim 7 further comprising separator means bonded to said opposite surface of said first mentioned substrate, said separator means having high thermal conductivity,
wherein said separate substrate is bonded to said separator means.

10. An electronic circuit as recited in claim 9 wherein said first mentioned substrate is bonded to one surface of said separator means and said separate substrate is bonded to an opposite surface of said separator means.

11. An electronic circuit as recited in claim 7 wherein said separate network is sealed in a glass housing for improved stability and operation.

12. An electronic circuit as recited in claim 7 wherein a plurality of connector pins are provided along one edge of said first mentioned substrate and a plurality of separate connector pins are provided along an edge of said separate substrate.

13. An electronic circuit as recited in claim 12 wherein said separate substrate is mounted to said first mentioned substrate in an arrangement selected to form a DIP structure.

14. An electronic circuit as recited in claim 13 wherein said separate substrate is mounted to said first mentioned substrate to form a combined structure having a pair of parallel edges,
said one edge of said first mentioned substrate and said one edge of said separate substrate being along opposite ones of said pair of edges of the combined structure.

15. An electronic circuit as recited in claim 12 wherein said separate substrate is mounted to said first mentioned substrate in an arrangement selected to form a SIP structure.

16. An electronic circuit as recited in claim 15 wherein said separate substrate is mounted to said first mentioned substrate to form a combined structure having a pair of parallel edges,
said one edge of said first mentioned substrate and said one edge of said separate substrate being along a common one of said pair of edges of the combined structure.

17. An electronic circuit as recited in claim 7 wherein said separate network comprises a resistive network of film resistors screened onto said separate substrate for controlling operation of said electrical circuit components on said component bearing surface of said first mentioned substrate.

18. An electronic circuit as recited in claim 17 wherein
said heat generating circuit means comprises film resistors screened on said substrate.

19. An electronic circuit as recited in claim 7 wherein
said heat generating circuit means comprises film resistors screened on said substrate.

20. An electronic circuit as recited in claim 7, wherein said arrangement comprises a hybrid circuit structure wherein at least one element of said temperature control means and said heat generating circuit means and/or at least one component of said electrical circuit comprises an integrated circuit and another element of said temperature control means and said heat generating circuit means and/or another component of said electrical circuit comprises a film resistor.

21. An oven arrangement for heating an electrical circuit to operate at a predetermined temperature for stabilizing electrical parameters thereof, comprising:
a thermally conductive substrate;
an electrical circuit formed on said substrate;
a temperature control means formed on said substrate; and
heat generating circuit means formed on said substrate for heating said electrical circuit via said thermally conductive substrate to operate at predetermined temperature conditions, said heat generating circuit means connected to and responsive to said temperature control means, said thermally conductive substrate maintaining said heat generating circuit means in close thermal conductivity with said heated electrical circuit for eliminating requirement of a heat enclosure therefor;

said electrical circuit including at least one component adhesively mounted on said substrate by an adhesive having high thermal conductivity, said temperature control means includes a further circuit adhesively mounted on said substrate by an adhesive having high thermal conductivity, and said heat generating circuit means comprising a plurality of resistors formed on said substrate, said electrical circuit component mounted on one surface of said substrate forming a component bearing surface, said heat generating resistors formed on the opposite surface of said substrate, said temperature control means including at least one component mounted on said component bearing surface of said substrate.

22. An oven arrangement as recited in claim 21, further including a hybrid electrical circuit structure wherein at least one element of said temperature control means and said heat generating circuit means and/or at least one component of said electrical circuit comprises an integrated circuit and another element of said temperature control means and said heat generating circuit means and/or another component of said electrical circuit comprises a film resistor, and further comprising a separate network formed of components matched to each other and comprising a high precision portion of said electrical circuit, said separate network formed on a separate substrate, said separate substrate adhesively mounted to said opposite surface of said first mentioned substrate by said adhesive having high thermal conductivity.

* * * * *